(12) United States Patent
Iwamoto

(10) Patent No.: US 8,669,477 B2
(45) Date of Patent: Mar. 11, 2014

(54) WIRING SUBSTRATE AND METHOD FOR MANUFACTURING THE SAME

(75) Inventor: Takashi Iwamoto, Urayasu (JP)

(73) Assignee: Empire Technology Development LLC, Wilmington, DE (US)

( * ) Notice: Subject to any disclaimer, the term of this patent is extended or adjusted under 35 U.S.C. 154(b) by 280 days.

(21) Appl. No.: 12/960,259

(22) Filed: Dec. 3, 2010

(65) Prior Publication Data

US 2011/0203839 A1  Aug. 25, 2011

(30) Foreign Application Priority Data

Feb. 24, 2010 (JP) ................................. 2010-038398

(51) Int. Cl.
*H05K 1/16* (2006.01)

(52) U.S. Cl.
USPC .......................................... 174/260; 361/783

(58) Field of Classification Search
USPC .......... 174/260, 252, 255, 262–265; 361/704, 361/709, 710, 719, 783
See application file for complete search history.

(56) References Cited

U.S. PATENT DOCUMENTS

| 4,197,142 A * | 4/1980 | Bolton et al. ................. 136/255 |
| 2010/0134239 A1* | 6/2010 | Wu et al. ....................... 338/308 |

FOREIGN PATENT DOCUMENTS

| JP | 2001-135914 A | 5/2001 |
| JP | 2003-101243 | 4/2003 |
| JP | 2004-311849 | 11/2004 |
| JP | 2004-319658 | 11/2004 |
| JP | 2005-266296 | 9/2005 |
| JP | 2007-128986 | 5/2007 |
| JP | 2008-078487 A | 4/2008 |
| JP | 2008-277684 | 11/2008 |
| JP | 2009-266573 | 11/2009 |

OTHER PUBLICATIONS

Machine Translation of Japanese Patent Application Publication No. 2001-101243 (Apr. 4, 2003). Inventors: Takano Akihito and Iijima Takahiro.*
Ito, N. et al., "New Advanced Fabrication Technique for Millimeter-Wave Planar Components based on Fluororesin Substrates using Graft Polymerization," Jpn. J. Appl. Phys. vol. 47, Issue 6, pp. 4755-4758, 2008.
Mischenko, A.S. et al., "Giant Electrocaloric Effect in Thin-Film PbZr0.95Ti0.05O3," Science, vol. 311, No. 5765, pp. 1270-1271, Mar. 3, 2006.
Neese, B. et al., "Large Electrocaloric Effect in Ferroelectric Polymers Near Room Temperature," Science Magazine, vol. 321, No. 5890, pp. 821-823, Aug. 8, 2008.
"ALH Series Metal Core CCL" UNIVACCO Technology accessed at http://www.kimmy.co.kr/DATA/Univac-coALHSeriesMetalCoreCCL.pdf, retrieved Nov. 6, 2009.

* cited by examiner

Primary Examiner — Jeremy C. Norris
Assistant Examiner — Tremesha S Willis
(74) Attorney, Agent, or Firm — Mashoff Brennan

(57) ABSTRACT

A wiring substrate with improved heat dissipation capability and with reduced size is disclosed. The wiring substrate includes a metal core substrate, a buffer layer formed so as to cover at least a part of the metal core substrate and containing a phase change material or a material with an electrocaloric effect, an electronic device mounted on a surface of a base including the metal core substrate and the buffer layer or inside the base, and a thermal via formed between the electronic device and the buffer layer.

19 Claims, 2 Drawing Sheets

WIRING SUBSTRATE AND METHOD FOR MANUFACTURING THE SAME

CROSS-REFERENCE TO RELATED APPLICATIONS

This application claims priority to Japanese Patent Application No. 2010-038398 filed Feb. 24, 2010, which is incorporated herein by reference in its entirety.

TECHNICAL FIELD

Embodiments disclosed herein relate to a wiring substrate and a method for manufacturing the wiring substrate.

BACKGROUND

The performance of various types of electronic equipment such as mobile phones and personal computers has been improved. In addition, such electronic equipment has been increasingly miniaturized. With such improved techniques, the amount of heat generated by electronic devices increases. Thus, there has been a demand for a new cooling technique for implementing small-sized high-performance equipment.

A technique has been proposed which uses a metal core substrate containing metal with a high heat conductivity instead of a heat sink in order to improve the heat dissipation capability of the electronic equipment without hindering the miniaturization thereof (see, for example, Japanese Patent Laid-Open No. 2004-311849). The metal core substrate is normally exposed at the outer edge of the wiring substrate. Heat from the metal core substrate is dissipated from this exposed portion to the exterior.

However, the heat dissipation capability (heat diffusion capability) of the metal core substrate is still insufficient to apply the metal core substrate to small-sized electronic equipment, which generate a particularly large amount of heat. Thus, a relatively large-sized heat sink or heat pipe or the like needs to be connected to the metal core substrate exposed at the outer edge of the wiring substrate. This disadvantageously hinders the miniaturization of electronic equipment.

BRIEF SUMMARY

A wiring substrate according to embodiments disclosed herein includes a metal core, a buffer layer formed so as to cover at least a part of the metal core, the buffer layer containing a phase change material or a material with an electrocaloric effect, and an electronic device mounted on a surface of a base including the metal core and the buffer layer or inside the base.

In some embodiments disclosed herein, heat generated by the electronic device is transmitted to the metal core, which diffuses the heat. At this time, a portion of the heat which cannot be diffused by the metal core itself is temporarily accumulated in the buffer layer containing the phase change material or the material with the electrocaloric effect. Examples of the phase change material include materials containing a substance the state of which is changed as a result of heat absorption. That is, examples of the phase change material include not only materials that change from a solid phase to a liquid phase as a result of heat absorption but also materials that are plastically deformed or fluidized as a result of heat absorption. The phase change (PC) material can exert a heat storage effect by repeatedly absorbing and releasing heat based on its melting point.

An example of a material with the electrocaloric effect is a material with the temperature thereof changed by an applied voltage. The material with the electrocaloric effect, for example, absorbs heat when a voltage is applied to the material and generates heat when the application of the voltage is stopped. Thus, the material with the electrocaloric effect can also repeatedly absorb and release heat in response to the application of the voltage and the stop of the application to exert the heat storage effect. Even if the amount of heat generated by the electronic device is such that not all of the heat can be absorbed or diffused by the metal core substrate, the heat can be temporarily absorbed by the buffer layer. Thus, the heat dissipation capability (heat diffusion capability) of the metal core can be improved.

In some embodiments disclosed herein, the buffer layer is formed so as to contact the metal core. This serves to reduce the heat resistance between the metal core and the buffer layer. Therefore, the heat can be efficiently transmitted from the metal core to the buffer layer.

In some embodiments disclosed herein, the metal core may be a metal layer used to dissipate heat from the wiring substrate. For example, the metal core may be a metal core substrate. Thus, a metal core with an area equivalent to that of the wiring substrate can be formed. This allows the heat diffusion capability of the metal core to be improved.

In some embodiments disclosed herein, the wiring substrate further includes a thermal via formed between the electronic device and the buffer layer. Thus, heat from the electronic device is efficiently transmitted to the metal core via the buffer layer.

A wiring substrate according to the embodiments disclosed herein includes a metal core substrate, a buffer layer formed so as to cover at least a part of the metal core substrate, the buffer layer containing a phase change material or a material with an electrocaloric effect, an electronic device mounted on a surface of a base including the metal core substrate and the buffer layer or inside the base, and a thermal via formed between the electronic device and the buffer layer.

A method of manufacturing a wiring substrate according to the embodiments disclosed herein includes forming a buffer layer containing a phase change material or a material with an electrocaloric effect so that the buffer layer covers at least a part of a metal core, and mounting an electronic device on a surface of a base including the metal core and the buffer layer or inside the base.

DETAILED DESCRIPTION

Figure 1:
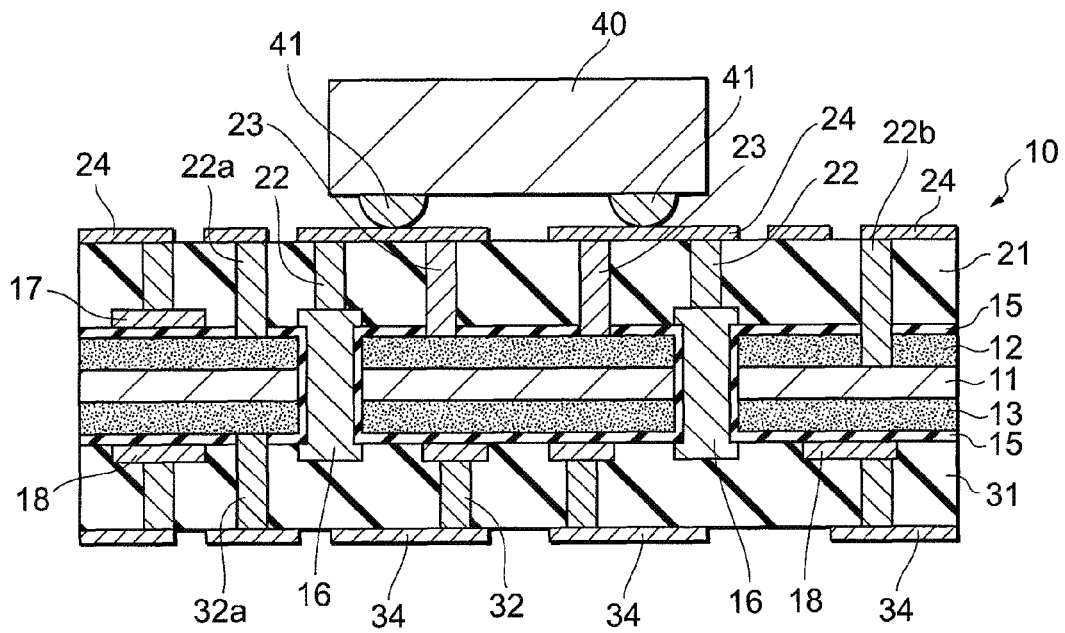
FIG. 1 is a sectional view showing a wiring substrate according to the present embodiment.
Figure 2:
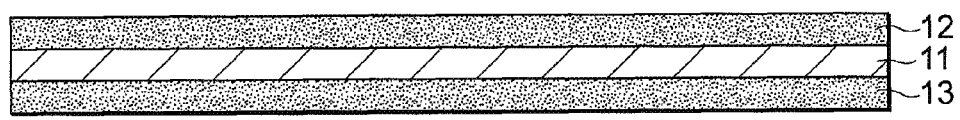
FIG. 2 is a sectional view showing a process of manufacturing a wiring substrate according to the present embodiment.

Embodiments disclosed herein will be described below with reference to the figures. In the figures, the same components are denoted by the same reference numerals, and duplicate descriptions are omitted. Furthermore, positional relations such as top and bottom and right and left are based on the illustrated positional relations unless otherwise specified. Moreover, the scaling of the figures is not limited to the illustrated one. In addition, the following embodiments are examples for description of the present disclosure, and the present disclosure is not intended to be limited to the embodiments disclosed herein. Moreover, many variations may be made to the embodiments disclosed herein without departing from the spirit of the present disclosure.

FIG. 1 is a sectional view showing a wiring substrate 1 according to a first embodiment. The wiring substrate 1 includes a base 10 and an electronic device 40 mounted on a front surface of the base 10.

The base 10 includes a metal core substrate 11 and buffer layers 12 and 13 formed to cover a front surface and a back surface, respectively, of the metal core substrate 11. Vias 16 are formed so as to penetrate the metal core substrate 11 and the buffer layers 12 and 13. An insulating layer 15 is formed between each of the vias 16 and the metal core substrate 11 and on front surfaces of the buffer layers 12 and 13. A wire 17 is formed on the insulating layer 15 on one surface side of the metal core substrate 11. Furthermore, a wire 18 is formed on the insulating layer 15 on the other surface side of the metal core substrate 11. An insulating layer 21 is formed on the wire 17. Vias 22, 22a, and 22b and thermal vias 23 are formed in the insulating layer 21. A wire 24 is formed on the insulating layer 21 and is partly connected to the vias 22, 22a, and 22b and the thermal vias 23. An insulating layer 31 is formed on the wire 18. Vias 32 and 32a are formed in the insulating layer 31. A wire 34 is formed on the insulating layer 31 and is partly connected to the vias 32 and 32a. Each of the layers will be described below in further detail.

The metal core substrate 11 is intended to diffuse heat generated by the electronic device 40. The metal core substrate 11 contains a metal material with a high heat conductivity. The metal core substrate 11 is exposed at the outer edge of the wiring substrate 1. Thus, heat from the metal core substrate 11 is dissipated from this exposed portion to the exterior of the wiring substrate 1. The metal core substrate 11 is formed of, for example, Cu, Al, a Cu—Fe—P alloy, or an Fe—Ni alloy. Furthermore, the metal core substrate 11 is utilized as an electrode potential or a ground potential. The thickness of the metal core substrate 11 is not limited to any particular thickness but is, for example, several hundred μm in some embodiments.

The buffer layers 12 and 13 are formed so as to cover the front and back surfaces of the metal core substrate 11. However, the buffer layers 12 and 13 may cover only at least a part of the metal core substrate 11. The buffer layers 12 and 13 are also formed so as to directly contact the metal core substrate 11. However, the buffer layers 12 and 13 may also be formed on the metal core substrate 11 via insulating layers. The buffer layers 12 and 13 contain a phase change material (hereinafter simply referred to as a PC material) or a material with an electrocaloric effect (hereinafter simply referred to as an EC material).

The PC material contains a substance whose state is changed as a result of heat absorption. Examples of the PC material include not only materials that change from a solid phase to a liquid phase as a result of heat absorption but also materials that are plastically deformed or fluidized as a result of heat absorption. The PC material demonstrates excellent heat storage performance as a result of a change in its state. That is, in some embodiments the PC material changes into a liquid to take heat from the surroundings when heated and changes into a solid to release heat when cooled. According to this principle, the PC material can repeatedly absorb and release heat based on its melting point to exert the heat storage effect. For example, PCS-LT-30 manufactured by Shin-Etsu Chemical Co., Ltd. may be used as the PC material. Table 1 shows the characteristics of the PCS-LT-30. Other examples of the PC material include, for example, $NaCH_3COO.3H_2O$ (melting point: 58° C., melting heat amount: 264 kJ/kg), stearic acid (melting point: 71° C., melting heat amount: 203 kJ/kg), and cetyl alcohol (melting point: 51° C., melting heat amount: 224 kJ/kg).

TABLE 1

| Characteristics | PCT-LT-30 |
| --- | --- |
| Initial thickness (μm) | 120 |
| Compressed thickness (μm) | 28 |
| Density 25° C. | 2.4 |
| Softening point (° C.) | 48 |
| Heat conductivity (W/mK) | 3.0 |
| Heat resistance ($cm^2 \cdot °C./W$) | 0.11 |
| Sheet Size (mm) | 300 × 400 |

The EC material has its temperature changed by an applied voltage. In particular, the embodiments disclosed herein use a material whose temperature is reduced by an applied voltage. The EC material absorbs heat when a voltage is applied to the material and generates heat when the application of the voltage is stopped. Examples of the EC material include, but are not limited to, inorganic materials such as PZT (lead zirconate titanate) and BST ($Ba_{0.8}Sr_{0.2}TiO_3$) and an organic material such as polyvinylidene fluoride.

The insulating layer 15 is formed in order to insulate the vias 16 from the metal core substrate 11. The insulating layer 15 is formed of, for example, a resin insulating material or an inorganic insulating material. However, the insulating layer 15 may be partly removed, and the vias 16 may be partly electronically connected to the metal core substrate 11. The following may be used as the resin insulating material: glass epoxy resin, polyimide, a fluorine resin such as polytetrafluoroethylene, polyurethane, polyvinylidene chloride, polyvinyl chloride, polyethylene, amilan, or polypropylene. Furthermore, silicon nitride, silicon dioxide, or the like may be used as the inorganic insulating material.

The via 16 is formed so as to penetrate the metal core substrate 11 and the buffer layers 12 and 13. The via 16 may be formed of a metal or alloy, for example, copper. In addition, aluminum, platinum, gold, silver, palladium, tin, nickel, chromium, or the like may also be used to form the via 16.

The wires 17 and 18 are patterned on the respective insulating layers 15 on opposite sides of the metal core substrate 11. The wires 17 and 18 may be formed of a metal or alloy, for example, copper. In addition, aluminum, platinum, gold, silver, palladium, tin, nickel, chromium, or the like may also be used as the wires 17 and 18.

The insulating layer 21 is formed of, for example, a resin insulating material or an inorganic insulating material. Examples of the resin insulating material include a glass epoxy resin, polyimide, a fluorine resin such as polytetrafluoroethylene, polyurethane, polyvinylidene chloride, polyvinyl chloride, polyethylene, amilan, or polypropylene. Furthermore, silicon nitride, silicon dioxide, or the like may be used as the inorganic insulating material.

The vias 22 include one type configured to connect the wire 24 to the wire 17 and another type configured to connect the wire 24 to the via 16. Furthermore, in the embodiments disclosed herein, the via 22a is configured to connect the wire 24 to the buffer layer 12, and the via 22b is configured to connect the wire 24 to the metal core substrate 11. The via 22b allows the metal core substrate 11 to be fixed to a predetermined potential such as a ground potential. Additionally, when the buffer layer 12 is formed of the EC material, the via 22a allows a voltage to be applied to the buffer layer 12. This enables the heat storage operation (heat absorption and generation operation) of the buffer layer 12 to be controlled. However, when the buffer layer 12 is formed of the PC material, the via 22a need not be formed. The vias 22, 22a, and 22b are formed of a material similar to that of the via 16.

The thermal via 23 is provided so as to efficiently transmit heat generated by the electronic device 40 to the metal core substrate 11. The thermal via 23 is formed of, for example, a material similar to that of the vias 22, 22a, and 22b. In the embodiments disclosed herein, one end of the thermal via 23 reaches the buffer layer 12. Thus, heat generated by the electronic device 40 is efficiently transmitted to the metal core substrate 11 via the buffer layer 12. Alternatively, one end of the thermal via 23 may penetrate the buffer layer 12 and reach the metal core substrate 11. In this case, heat generated by the electronic device 40 is transmitted directly to the metal core substrate 11.

The insulating layer 31, vias 32 and 32a, and wire 34 formed on the wire 18 are formed of materials similar to those of the insulating layer 21, vias 22, 22a, and 22b and wire 24. The vias 32 include one type configured to connect the wire 34 to the wire 18 and another type configured to connect the wire 34 to the via 16. The via 32a is configured to connect the wire 34 to the buffer layer 13. In particular, when the buffer layer 13 is formed of the EC material, the via 32a allows a voltage to be applied to the buffer layer 13. This enables the heat storage operation of the buffer layer 13 to be controlled. However, when the buffer layer 13 is formed of the PC material, the via 32a need not be formed.

The electronic device 40 is mounted on the front surface of the base 10 that includes the metal core substrate 11, the buffer layers 12 and 13, and the wires 24 and 34 formed on the respective surfaces thereof. In the embodiments disclosed herein, the electronic device 40 is mechanically fixed and electrically connected to the wire 24 via bumps 41. An anisotropic conductive resin may be interposed between the electronic device 40 and the base 10. The example shown in FIG. 1 corresponds to a face down mounting where the electronic device 40 is mounted with its circuit surface directed toward the substrate. However, a face up mounting, where the electronic device 40 is mounted such that its surface opposite to the circuit surface is directed toward the substrate, may also be adopted. In the face up mounting case, the surface of the electronic device 40 opposite to its circuit surface is fixed to the base 10 via an adhesive. Then, terminals of the electronic device 40 are electrically connected to the wire 24 via bonding wires. In the illustrated embodiment, the electronic device 40 is mounted on the front surface of the base 10. However, the electronic device 40 may also be mounted inside the base 10. In such case, a hole is formed in the base 10 so that the electronic device 40 can be mounted in the hole, and the electronic device 40 is embedded in the hole.

Examples of the electronic device 40 include a passive element such as a capacitor or a resistive element, and an active element such as an IC chip. Alternatively, such an electronic device may be an image sensor such as a CCD sensor or a CMOS sensor or a display element such as a liquid crystal display element.

A method for manufacturing the above-described wiring substrate will now be described with reference to FIG. 2 to FIG. 6. First, for example, the metal core substrate 11 that is formed of copper is prepared. Buffer layers 12 and 13 are formed on the front and back surfaces, respectively, of the metal core substrate 11. If the EC material or PC material used as the buffer layers 12 and 13 is a sheet-like material such as PCS-LT-30, sheets formed of such a material may be stuck to the front and back surfaces, respectively, of the metal core substrate 11 in a stacked manner. Furthermore, if the EC material or PC material used as the buffer layers 12 and 13 is powdery, the buffer layers 12 and 13 may be formed as follows. The powder is covered with a semi-cured (B stage) epoxy resin or the like to form microcapsules. The microcapsules are then dispersed in an appropriate solvent such as alcohol. The solution containing the microcapsules is coated and dried on the metal core substrate 11.

Figure 3:
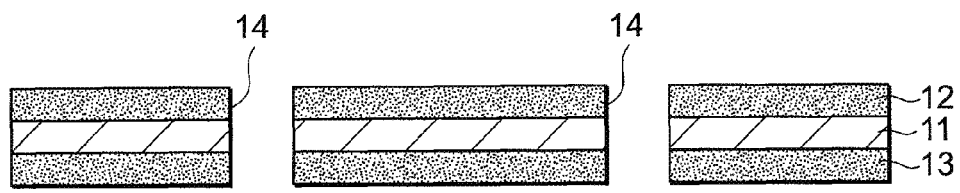
FIG. 3 is a sectional view showing the process of manufacturing a wiring substrate according to the present embodiment.

Next, as shown in FIG. 3, via holes 14 are formed so as to penetrate the metal core substrate 11 and the buffer layers 12 and 13. Examples of a method for forming the via holes 14 include a processing method using a drill, a processing method using a laser, and a processing method using a lithography technique and an etching technique.

Figure 4:
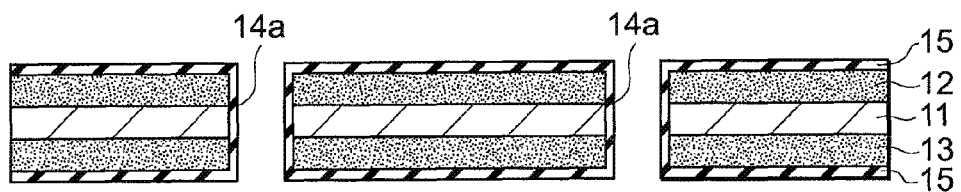
FIG. 4 is a sectional view showing the process of manufacturing a wiring substrate according to the present embodiment.

Next, as shown in FIG. 4, an insulating layer 15 is formed over the surface of each of the via holes 14 including the inner wall thereof. For example, two resin films are arranged on and thermocompression-bonded to the respective opposite sides of the buffer layers 12 and 13. Then, the insulating layer 15 is formed over the surface of the via hole 14 so as to fill the via hole 14. Thereafter, a central portion of the insulating layer 15 with which the via hole 14 is filled is removed. Thus, a via hole 14a is formed which includes an inner wall formed of the insulating layer 15. The via hole 14a is formed in the same manner as that in which the via hole 14 is formed. Alternatively, a liquid resin is coated over the via hole 14 before the central portion of the insulating layer 15 with which the via hole 14 is filled is removed. Alternatively, a homogeneous insulating layer 15 may be formed, by a CVD (Chemical Vapor Deposition) method or the like, over the surface of the via hole 14 including the inner wall thereof.

Figure 5:
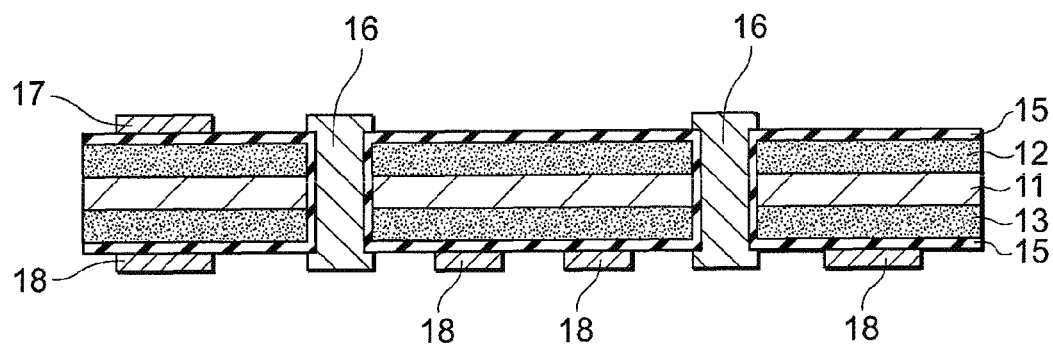
FIG. 5 is a sectional view showing the process of manufacturing a wiring substrate according to the present embodiment.

Then, as shown in FIG. 5, a conductor is filled into the via hole 14a to form a via 16. Wires 17 and 18 are patterned on the insulating layer 15. Electroless plating or conductor paste may be used as a method for embedding the conductor. For example, vias 16 and wires 17 and 18 are formed by electroless plating as follows. A metal film such as copper is formed over the surface of the via hole 14a including the inner wall thereof. This metal film is patterned using the photolithography technique. However, a pattern forming method for forming the wires 17 and 18 is not limited to the above-described subtract method (the method of forming wires by removing the unwanted portion of the metal layer, with the required portion thereof left). For example, an additive method may be used. If the additive method is used, the following procedure may be used. For example, a resist is coated on the buffer layers 12 and 13 and exposed and developed to form a resist pattern. A metal film is then formed over the surface by electroless plating. Then, the resist pattern and the metal layer deposited on the resists pattern are removed.

Figure 6:
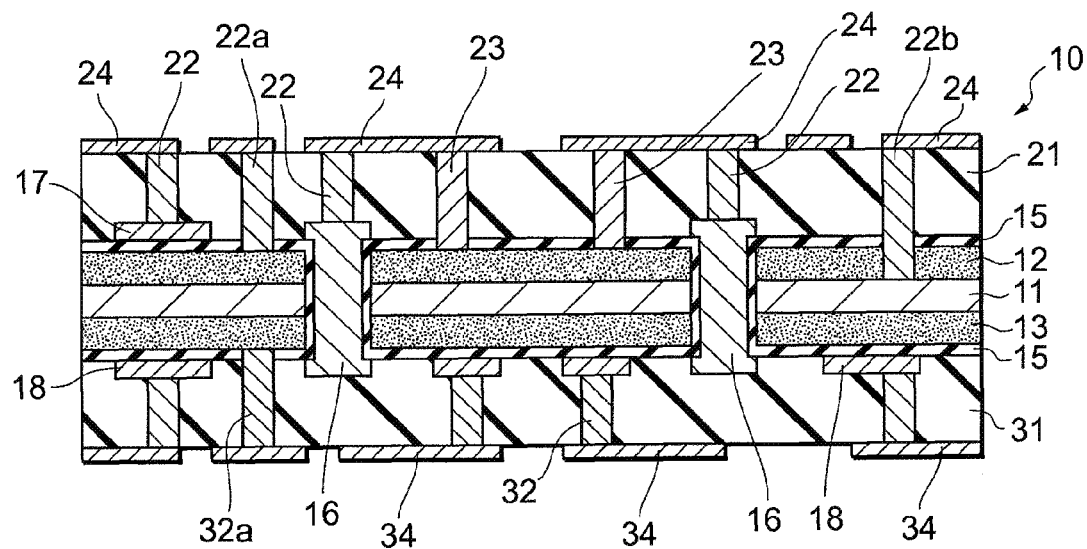
FIG. 6 is a sectional view showing the process of manufacturing a wiring substrate according to the present embodiment.

Next, as shown in FIG. 6, an insulating layer 21, vias 22, 22a, and 22b, a thermal via 23, and a wire 24 are formed as an upper layer on the wire 17. An insulating layer 31, vias 32 and 32a, and a wire 34 are formed as an upper layer on the wire 18. The insulating layer 21 is formed of, for example, a photosensitive resin and exposed and developed to form via holes therein. The insulating layer 15 and buffer layer 12 exposed in each of the via holes are etched as needed. Conductors are filled into the via holes to form the vias 22, 22a, and 22b and the thermal via 23. The wire 34 is patterned on the insulating layer 21. The conductors are filled into the via holes in the same manner as that in which conductors are filled into the via holes 14a. The upper layer is formed on the wire 18 in the same manner as that in which the upper layer is formed on the wire 17.

Alternatively, via holes may be formed in the insulating layer 21 as follows. A nonphotosensitive resin is used as the insulating layer 21. A resist pattern is formed on the insulating layer 21 by the photolithography technique. The insulating layer 21 exposed by the resist pattern is then etched. Alternatively, a prepreg including a glass cloth impregnated with an insulating resin may be used as the insulating layer 21. The method for forming the upper layer on the wire 17 is similarly applicable to the formation of the upper layer on the wire 18.

After the base 10 is manufactured as described above or in some other suitable manner, the electronic device 40 such as an IC chip is mounted on the front surface of the base 10. For example, the electronic device 40 is mounted on the base 10 via bumps formed of solder or the like (see FIG. 1). Alternatively, the electronic device 40 may be mounted face down on the base 10 by thermocompression-bonding the electronic device 40 and the base 10 to each other with an anisotropic conductive film interposed between the circuit surface of the electronic device 40 and the base 10. Alternatively, the electronic device 40 may be mounted face up on the base 10. In this case, for example, the surface of the electronic device 40 opposite to the circuit surface may be secured on the base 10 with an adhesive. The circuit surface of the electronic device 40 may then be electrically connected to the wire 24 of the base 10 with bonding wires.

In the wiring substrate according to the embodiments disclosed herein, heat generated by the electronic device 40 is transmitted to the metal core substrate 11 through the thermal via 23, the insulating layer 21, and the buffer layer 12. The heat is then dissipated to the exterior through the metal core substrate 11. Here, a portion of the heat which cannot be diffused by the metal core substrate 11 is temporarily absorbed by the buffer layers 12 and 13 located around the periphery of the metal core substrate 11.

If PC material is used as the buffer layers 12 and 13, when the temperature of the metal core substrate 11 exceeds the melting point of the PC material, the PC material changes from a solid phase to a liquid phase (fluent material) and absorbs heat from the metal core substrate 11. The PC material can store an amount of heat corresponding to the melting heat amount of the PC material. This principle serves to suppress an excessive increase in the temperature of the metal core substrate 11. As the temperature of the metal core substrate 11 decreases, the PC material changes from the liquid phase (fluent material) to the solid phase to release heat to the metal core substrate 11. The heat absorbed by the metal core substrate 11 is released to the exterior. When the PC material is used, such a heat storage principle as described above allows the PC material to function as a buffer layer for the metal core substrate 11.

When EC material, whose temperature is reduced by an applied voltage, is used as the buffer layers 12 and 13, the EC material acts similarly to the PC material. That is, application of a voltage to the buffer layers 12 and 13 enables the EC material to absorb heat from the metal core substrate 11. This suppresses an excessive increase in the temperature of the metal core substrate 11. Then, when the application of the voltage to the buffer layers 12 and 13 is stopped, the buffer layers 12 and 13 release the heat to the metal core substrate 11. The heat absorbed by the metal core substrate 11 is released to the exterior. When the EC material is used, such a heat storage principle as described above allows the EC material to function as a buffer layer for the metal core substrate 11.

As described above, in the embodiments disclosed herein, even if the amount of heat generated by the electronic device 40 is such that not all of the heat can be absorbed by the metal core substrate 11, the heat can be temporarily absorbed by the buffer layers 12 and 13. Thus, the heat dissipation capability (heat diffusion capability) of the metal core substrate 11 can be improved. This eliminates the need to attach a large-sized heat sink or heat pipe to the metal core substrate 11. Therefore, a wiring substrate applicable to small-sized electronic equipment can be provided.

As described above, the embodiments disclosed herein are not limited to the above-described embodiments. Many variations may be made to the embodiments without departing from the spirits of the embodiments disclosed herein. For example, the metal core according to the present disclosure is not limited to the metal core substrate but may be a metal via.

The wiring substrate according to the embodiments disclosed herein can be utilized for almost all of the electronic equipment. Examples of the electronic equipment to which the wiring substrate according to the embodiments disclosed herein is applicable include, but are not limited to, a mobile phone, an IC card, a liquid crystal display, a plasma display, a car navigation, a game machine, a digital camera, a DVD player, a CD player, a electronic notebook, an electronic dictionary, a personal computer, a personal digital assistance, a video camera, and a printer.

What is claimed is:

1. A wiring substrate comprising:
   a metal core substrate;
   a buffer material formed in contact with opposite surfaces of the metal core substrate, the buffer material including a phase change material configured to absorb heat from and release the heat to the metal core substrate;
   an insulation material formed on surfaces of the buffer material opposite the metal core substrate;
   an electronic device mounted on a surface of a base of the wiring substrate or mounted inside the base, wherein the base includes the metal core substrate and the buffer material;
   a via formed so as to penetrate the metal core substrate and the buffer material, wherein the insulation material is formed between the via and the metal core substrate; and
   a thermal via formed between the electronic device and the buffer material to enable heat from the electronic device to be transmitted to the metal core substrate through the buffer material.

2. The wiring substrate according to claim 1, wherein the electronic device is mounted to the surface of the base by solder bumps.

3. The wiring substrate according to claim 1, further comprising a wire attached to a top surface of the base.

4. The wiring substrate according to claim 3, further comprising a via configured to couple the wire to the metal core substrate.

5. The wiring substrate according to claim 1, wherein the buffer material comprises a first buffer layer positioned on a first surface of the metal core substrate and a second buffer layer positioned on a second surface of the metal core substrate opposite the first surface such that the metal core substrate is in between the first and second buffer layers.

6. A wiring substrate comprising:
   a metal core;
   a buffer material formed in contact with opposite surfaces of the metal core, the buffer material including a material with an electrocaloric effect configured to absorb heat from and release the heat to the metal core;
an insulation material formed on surfaces of the buffer material opposite the metal core;
an electronic device mounted on a surface of a base including the metal core and the buffer material or inside the base;
a via formed so as to penetrate the metal core and the buffer material, wherein the insulation material is formed between the via and the metal core; and
a thermal via formed between the electronic device and the buffer material to enable heat from the electronic device to be transmitted to the metal core through the buffer material.

7. The wiring substrate according to claim 6, wherein the buffer material is formed so as to contact the insulation material and is sandwiched between the insulation material.

8. The wiring substrate according to claim 6, wherein the metal core is a metal core substrate.

9. The wiring substrate according to claim 6, wherein the thermal via formed between the electronic device and the buffer material contacts the buffer material at a first end and extends through the insulation material.

10. The wiring substrate according to claim 6, wherein the buffer material comprises a first buffer positioned on a first surface of the metal core and a second buffer layer positioned on a second surface of the metal core opposite the first surface such that the metal core is in between the first and second buffer layers.

11. The wiring substrate according to claim 6, wherein the electronic device is mounted to the surface of the base by solder bumps.

12. The wiring substrate according to claim 9, wherein the thermal via terminates at a wire attached to a top surface of the base.

13. A method for manufacturing a wiring substrate, the method comprising:
forming a buffer material on opposite surfaces of a metal core, the buffer material containing one of a phase change material and a material with an electrocaloric effect configured to absorb heat from and release the heat to the metal core;
forming an insulation material over surfaces of the buffer material and the metal core;
forming at least one thermal via through the insulation material and in contact with the buffer material;
forming a via that penetrates the metal core and the buffer material;
forming the insulation material between the via and the metal core and the buffer material; and
coupling an electronic device to the at least one thermal via to enable heat from the electronic device to be transmitted to the metal core through the buffer material.

14. The method according to claim 13, further comprising:
forming the at least one thermal via between the buffer material and a wire on a surface of a base including the metal core and the buffer material or inside the base; and
positioning the electronic device on the surface of the base such that the electronic device is coupled with the wire.

15. The wiring substrate of claim 1, wherein the via is configured to enable heat from the electronic device to be transmitted to the metal core substrate.

16. The wiring substrate of claim 6, wherein the via is configured to enable heat from the electronic device to be transmitted to the metal core.

17. The wiring substrate of claim 6, wherein the via is a first via, the wiring substrate further comprising a second via formed so as to apply a first voltage to the buffer material.

18. The wiring substrate of claim 17, further comprising a third via formed so as to apply a second voltage to the metal core that is different from the first voltage, wherein the difference between the first voltage and the second voltage changes the electrocaloric effect of the buffer material.

19. The method of claim 13, wherein the via is configured to enable heat from the electronic device to be transmitted to the metal core.

* * * * *

UNITED STATES PATENT AND TRADEMARK OFFICE
CERTIFICATE OF CORRECTION

| | |
|---|---|
| PATENT NO. | : 8,669,477 B2 |
| APPLICATION NO. | : 12/960259 |
| DATED | : March 11, 2014 |
| INVENTOR(S) | : Iwamoto |

It is certified that error appears in the above-identified patent and that said Letters Patent is hereby corrected as shown below:

On the Title Page

Item (74), under "Attorney, Agent or Firm", in Column 2, Line 1, delete "Mashoff Brennan" and insert -- Maschoff Brennan --, therefor.

In the Claims

In Column 9, Line 25, in Claim 10, after "first buffer", insert -- layer --.

Signed and Sealed this
Eighth Day of July, 2014

Michelle K. Lee
*Deputy Director of the United States Patent and Trademark Office*